United States Patent [19]

Thompson et al.

[11] 4,394,673
[45] Jul. 19, 1983

[54] RARE EARTH SILICIDE SCHOTTKY BARRIERS

[75] Inventors: Richard D. Thompson, Millwood, N.Y.; Boryeu Tsaur, Arlington, Mass.; King-Ning Tu, Chappaqua, N.Y.

[73] Assignee: International Business Machines Corporation, Armonk, N.Y.

[21] Appl. No.: 191,565

[22] Filed: Sep. 29, 1980

[51] Int. Cl.$^3$ ............................................. H01L 29/48
[52] U.S. Cl. ...................................... 357/15; 357/67; 357/71
[58] Field of Search ............................. 357/15, 67, 71

[56] References Cited

U.S. PATENT DOCUMENTS

| 3,943,552 | 3/1976 | Shannon et al. | 357/15 |
| 3,964,084 | 6/1976 | Andrews et al. | 357/15 |
| 4,107,835 | 8/1978 | Bindell et al. | 357/15 |
| 4,214,256 | 7/1980 | Dalal et al. | 357/15 |

OTHER PUBLICATIONS

Berenbaum et al., IBM Tech. Discl. Bulletin, vol. 22, No. 10, Mar. 1980, pp. 4521–4522.
Chu et al., IBM Tech. Discl. Bulletin, vol. 21, No. 3, Aug. 1978, pp. 1054–1057.

Primary Examiner—William D. Larkins
Attorney, Agent, or Firm—B. N. Wiener; Yen S. Yee

[57] ABSTRACT

In the practice of this disclosure, rare earth disilicide low Schottky barriers ($\lesssim 0.4$ eV) are used as low resistance contacts to n-Si. Further, high resistance contacts to p-Si (Schottky barrier of $\gtrsim 0.7$ eV) are also available by practice of this disclosure. A method is disclosed for forming contemporaneously high ($\gtrsim 0.8$ eV) and low ($\lesssim 0.4$ eV) energy Schottky barriers on an n-doped silicon substrate. Illustratively, the high energy Schottky barrier is formed by reacting platinum or iridium with silicon; the low energy Schottky barrier is formed by reacting a rare earth with silicon to form a disilicide. Illustratively, a double layer of Pt/on W is an effective diffusion barrier on Gd and prevents the Gd from oxidation.

10 Claims, 4 Drawing Figures 4,394,673

RARE EARTH SILICIDE SCHOTTKY BARRIERS

DESCRIPTION

TECHNICAL FIELD OF INVENTION

This invention relates to a semiconductor device having Schottky barrier silicide contacts and to a method therefor.

BACKGROUND OF THE INVENTION

Schottky barrier height is an important physical property of silicides as contacts to n-Si. Silicides having a high barrier height are known for semiconductor devices. However, there is need in bipolar semiconductor devices for low barrier silicide contacts. Transition metal silicides with a barrier lower than 0.5 eV have not been produced.

Silicides such as PtSi and IrSi have a barrier higher than 0.85 eV on n-Si and can be formed by reacting Pt or Ir on Si at 400° for 30 minutes.

U.S. Pat. No. 3,349,297 discloses a semiconductor device wherein two metals having different barrier potential heights are employed in relation to a semiconductor material. In order to establish the available potential difference, it is necessary to have regions of both p-doped and n-doped silicon.

U.S. Pat. No. 3,968,272 discloses a method for creating low height for Schottky barriers. Schottky barriers that are between 0.15 eV and 0.20 eV are obtained by heat treatment of p-doped silicon on which palladium and platinum is deposited. If hafnium is placed onto n type silicon and heat treated at 400°±25° C., there is obtained a Schottky barrier of 0.15 eV.

U.S. Pat. No. 4,107,835 teaches the sharpening of the profile of a dopant beneath a metal silicide. The dopant is incorporated into the surface of a silicon substrate by ion implantation. Then, metal is deposited onto the surface and reacts with the silicon when heated. The dopant accumulates at the advancing surface of the metal silicide; and it may modify the Schottky barrier height slightly.

OBJECTS OF THE INVENTION

It is an object of this invention to provide a silicide contact on n-Si of about 0.4 eV Schottky barrier height.

It is another object of this invention to provide a large scale integrated n-Si circuitry wherein high and low barrier silicides contacts are utilized.

It is another object of this invention to provide for the contemporaneous information of high ($\gtrsim 0.8$ eV) and low ($\lesssim 0.4$ eV) Schottky barriers on n-Si.

SUMMARY OF THE INVENTION

Disilicides of rare earth metals, e.g., Gd, Er, Dy, Ho and like rare earth metals; Y and La are disclosed having Schottky barrier height around 0.4 eV and lower. Disilicides of films of Gd, Er, Dy, Ho, Y and La have been formed for the practice of this invention by reacting these metal films with Si around 300° C. to 400° C. for 30 minutes in He atmosphere. Thus, it has been shown that disilicides of rare earth metals such as GdSi$_2$ have a barrier $\lesssim 0.4$ eV and these silicides can be formed at $\lesssim 400°$ C. by contact reaction.

In the practice of this invention, a silicon semiconductor device is provided with both high and low Schottky barriers being silicides. Illustratively, the high barrier metal Pt or Ir can also be used as a diffusion barrier to protect the low barrier metal or rare earth disilicide from oxidation or reaction with other contamination.

PRACTICE OF THE INVENTION

Figure 1:
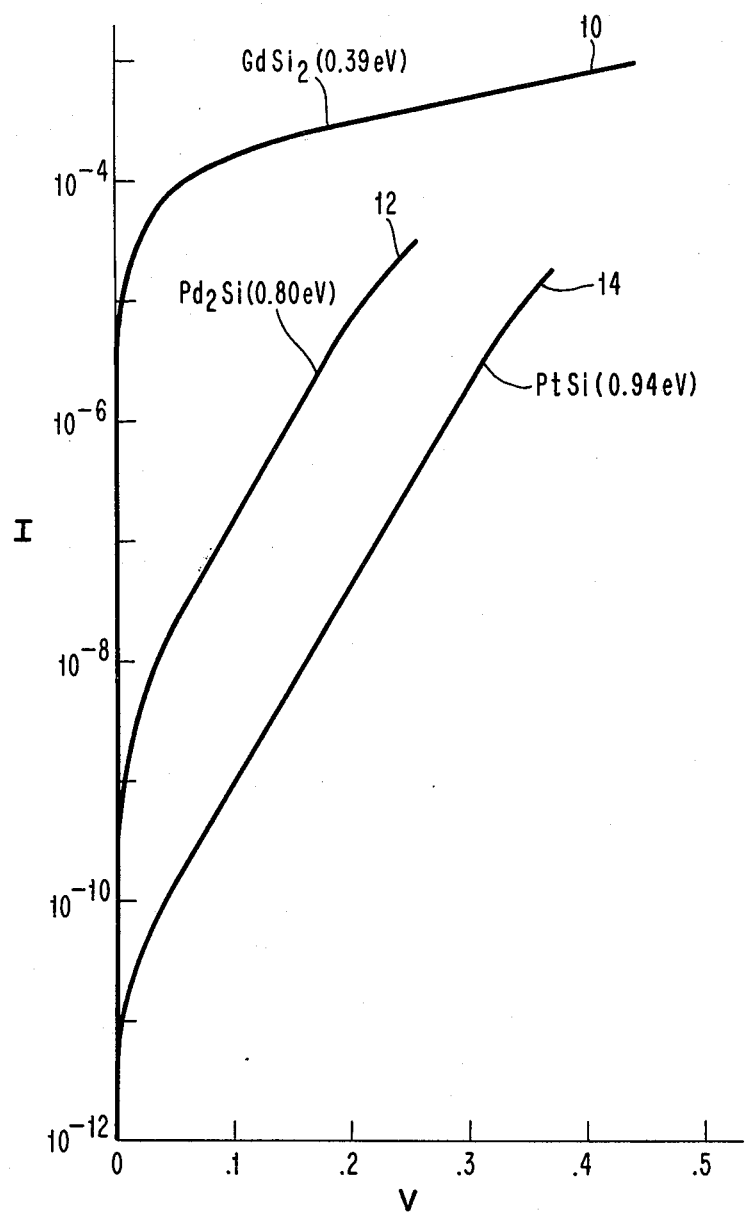
FIG. 1 presents I-V curves for GdSi$_2$, Pd$_2$Si and PtSi illustrating the relative difficulty of measuring their respective Schottky barrier heights.

FIG. 1 presents I-V curves for GdSi$_2$ (10), Pd$_2$Si (12), and PtSi (14) illustrating the relative difficulty of measuring their respective Schottky potential barrier heights. These curves demonstrate that rare earth disilicides, such as GdSi$_2$ (10), have very low Schottky barrier heights on n-Si which can not be measured via the conventional I-V technique. They were measured by both computer fitting of these curves to theory, and plotting of I vs. [exp(qV/kT) − 1], and also by measurement on p-Si. All methods gave comparable results, i.e., $\phi_{Bn} \simeq 0.39$.

This figure demonstrates that the Schottky barrier height of a disilicide on n-Si is not measurable from the current intercept of an extrapolation of the linear region at V=0. For example, the curve 10 for GdSi$_2$ does not have a linear region to extrapolate. The apparent linear region above approximately 0.1 volts is caused by the series resistance of the diode and not its Schottky barrier height.

The disilicides for the practice of this invention have been identified by X-ray diffraction and ion backscattering detection. Their Schottky barrier heights have been measured by I-V technique on contact holes with diameter from 1 to 16 mils. Exemplary average values of the barrier heights are listed in Table I.

Figure 2:
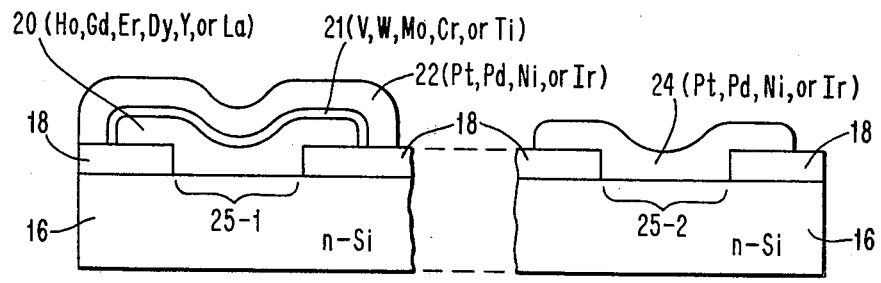
FIG. 2 presents a diagram of a semiconductor device with high potential Schottky barrier and low potential Schottky barrier utilizing silicides therefor.

FIG. 2 presents a schematic line diagram of a semiconductor device with high potential Schottky barrier and low potential Schottky barrier. It demonstrates an example of the contemporaneous formation of high and low barrier height silicide at different locations of a large scale integrated circuit. In it, the recited numbers indicate the following: layer 16 is n-Si substrate; layer 18 is isolation SiO$_2$; layer 20 is low barrier rare earth Ho, Gd, Er, Dy, Y, or La of about 1000 Å thickness; layer 21 is part of the diffusion barrier and is V, M, Mo, Cr or Ti of about 200 Å thickness; layer 22 is the other part of the diffusion barrier and is Pt, Pd, Ni and Ir of about 1000 Å thickness; layer 24 is a high barrier such as Pt, Pd, Ni, or Ir.

Illustratively, for the diagram shown in FIG. 2, Pt and Gd disilicides are examples of high and low Schottky barriers. After depositing Gd on the low contact area 25-1 and W on top of the Gd, Pt is deposited on the thin layer of W and on the high contact area 25-2. Annealing at approximately 400° produces GdSi$_2$ on the low contact barrier and PtSi on the high contact barrier area. It is crucial that the Gd be protected from oxidation, e.g. by Pt, when it reacts with Si. However, if the high barrier contact is not required, refractory metals can be utilized as the diffusion barrier for the low barrier contact, e.g., V, W, Cr, Mo and Ti.

Once the layer 18 of the isolation $SiO_2$ is grown and etched, the n-silicon wafer 16 is masked so that only the areas for the low barrier contacts are open during deposition, and Gd is deposited on these areas. If a double layer diffusion layer is used, the first layer, e.g., W (21), is also now deposited without breaking deposition vacuum. The areas for high barrier contacts are also opened and the layers labeled 22 and 24 are deposited.

Subsequent annealing at 400° C. for 30 min. will cause both layers 22 and 24 to react with the underlying n-Si substrate 16 to form silicides having beneficial barrier heights.

Figure 3:
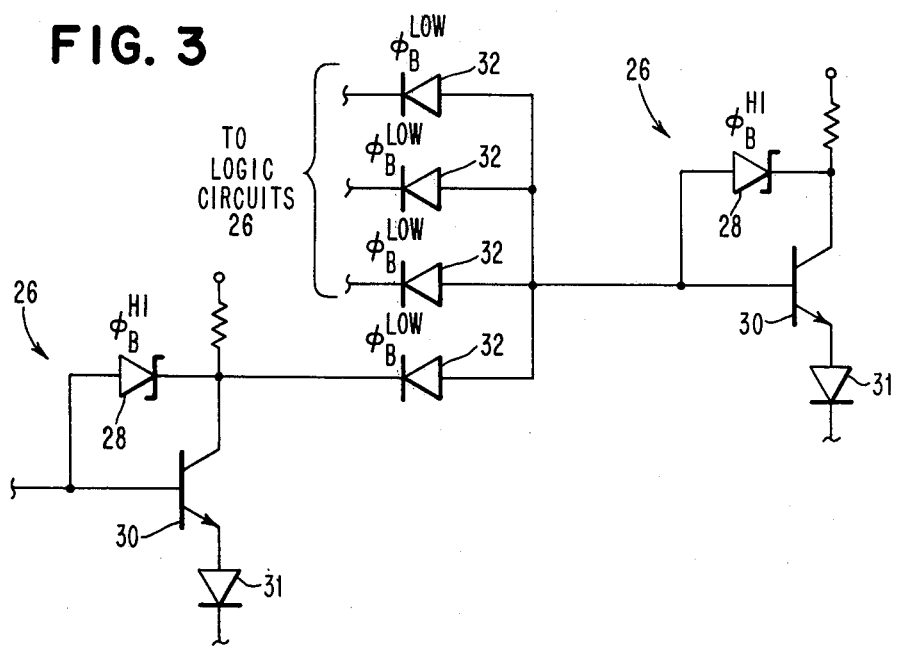
FIG. 3 is an exemplary logic circuit wherein the low potential Schottky barrier rare earth disilicides are utilized to improve the noise margin.

FIG. 3 is an exemplary logic circuitry wherein low potential Schottky barrier rare earth disilicides are utilized to improve the noise margin. The numbers of FIG. 3 signify as follows: 26 is logic circuit; 28 is high Schottky barrier diode; 30 is a transistor; 31 is a diode; and 32 is low Schottky barrier diode.

Noise margin characterizes the standard circuit of FIG. 3 i.e., the difference in voltage of the transistor 30 from "on" and "off". This noise margin is approximately equal to the difference in Schottky barrier heights of the diodes 28 and 32. It is desirable to have maximum noise margin. The practice of this invention which provides both high barrier diodes and low barrier diodes optimizes the operation of the circuitry of FIG. 3.

Figure 4:
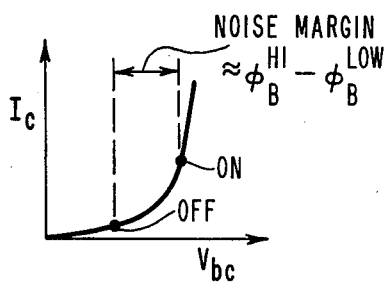
FIG. 4 is a curve which illustrates the beneficial noise margin obtained by the practice of this invention in logic circuitry utilizing rare earth disilicides for low potential Schottky barrier diodes.

FIG. 4 is a curve which illustrates the beneficial noise margin obtained by the practice of this invention in the logic circuitry of FIG. 3 utilizing rare earth disilicides for low potential Schottky barrier diodes.

EXPERIMENTS FOR THE INVENTION

Reactions between Si and thin films of rare earth metals Ce, Gd, Dy, Ho, Er, Y and La in the temperature range of 275° C. to 900° C. were studied using X-ray diffraction and ion backscattering spectrometry. Apparently, the disilicide phase of these metals first forms rapidly within a narrow temperature range, 325° C. to 400° C., and are stable up to 900° C.

The rare earths Ce, Gd, Dy, Ho, Er, Y and La were deposited by electron-gun evaporation onto buffered HF cleaned <100> and <111> surfaces of bare and diode Si wafers in a vacuum of $10^{-7}$ torr to a thickness of approximately 2000 Å at rates of about 10 Å/sec. The wafers are maintained at 100° C. throughout the deposition. These were examined and then annealed in a resistance furnace in a He atmosphere at temperatures ranging from 275° C. to 900° C. over minutes to hours. Oxygen was filtered from the He atmosphere by passing it over a bed of Ti held at 900° C. This reduced the estimated oxygen partial pressure to near $10^{-9}$ torr. Due to the severe oxidation problem encountered in the annealing of rare earth metal films, the wafers were also placed face down on a sapphire wafer and buried with chips of another wafer of the same material during the annealings thereby further reducing the amount of oxygen reaching the film surface. Some wafers were protected from oxidation by depositing a layer of Pt, W, or V without breaking deposition vacuum and therefore did not need the above protective measures.

Electron microprobe was used to characterized the impurity levels of the films both before and after annealing. Only oxygen impurity was observed, i.e., content <0.1 w/o and the oxygen impurity level was consistent with the existence of a native oxide film. Seeman-Bohlin X-ray diffraction was used to identify phases and structures while $MeV^4He^+$ ion backscattering was used to obtain compositional profiles with respect to depth.

The metals reacted with silicon at temperatures lower than 400° C. in less than 30 minutes to form disilicides as the only phase and were stable up to 900° C. The temperature range for the time for complete reaction to vary from around $\frac{1}{4}-\frac{1}{2}$ hour to several hours was very narrow (i.e., <50° C.). Annealing at lower temperatures did not produce any detectable interfacial reactions within a time period of days. These disilicides had a very uniform and sharp interface with the underlying Si as observed from their backscattering spectra.

Both the ion backscattering and optical microscope studies indicated that the disilicide nucleated in a few spots and then grew as isolated islands. The ion backscattering spectra were sensitive to the position of the beam on the partially reacted samples. Thus, spectra were obtained anywhere from non-reacted to fully reacted just by moving the beam.

Table II presents a summary of the annealing conditions, the results of the annealings, the crystal structures, melting points, and the measured sheet resistivity of both the metals and their disilicides. The as-deposited resistivities are about a factor of two higher than the corresponding bulk values and the comparison of the metal with its disilicide demonstrates that the disilicides are good electrical conductors.

THEORY FOR THE INVENTION

The reaction temperatures show no dependence on the melting point of the metal which varies from 795° C. for Ce to 1497° C. for Er. As the melting points of the disilicides are high it is theorized that a high free energy of formation may be the large driving force for their formation. Further, the rare earths and Y and La have two 's' valence electrons so the disilicide should be a very stable compound.

Although the driving force for disilicide formation is expected to be large from known theoretical considerations, the discovery for the practice of this invention of formation temperatures below 400° C. is quite surprising from consideration of the kinetics involved. Transition metal disilicides have not previously been found in the prior art to form at such low temperatures, as presented by K. N. Tu and J. W. Mayer, Chapter 10, "Thin Film-Interdiffusion and Reactions", ed. by J. M. Poate et al, Wiley Interscience, New York (1978). To meet the requirements of the kinetics involved, a continuous supply of Si is needed in the disilicide formation. Clearly, it is surprising that such a continuous supply of Si is actually maintained at the relatively low temperatures utilized for the practice of this invention.

It is not known how the covalent bonds of Si are broken at such low temperatures. Near noble metals can react with Si at around 200° C. forming metal rich silicides such as $Pd_2Si$, wherein metal atoms have been found to dominate the diffusion during the silicide growth. A proposed mechanism, which invokes metal interstitials to weaken the covalent bonds in Si can explain the low temperature reaction, of near noble metals, e.g., Pd, on Si, is presented by K. N. Tu, Appl. Phys. Letters, Vol. 27, 221 (1975). However, the kinetic mechanism which leads to the formation of rare earth disilicides at such low temperatures is still not clearly understood theoretically.

TABLE I

| Schottky Barrier Height of Rare Earth Disilicides | | | | | |
|---|---|---|---|---|---|
| Disilicide | $GdSi_2$ | $ErSi_2$ | $DySi_2$ | $HoSi_2$ | $YSi_2$ |
| $\phi_b$(ev) | 0.39 ± 0.06 | 0.39 ± 0.06 | 0.37 ± 0.06 | 0.37 ± 0.06 | 0.39 ± 0.06 |

TABLE II

| Summary of Annealing Results of Rare Earth Metals on Si | | | | | | |
|---|---|---|---|---|---|---|
| Element | Gd | Dy | Ho | Er | Y | La |
| Structure | Hex | Hex | Hex | Hex | Hex | Hex/cu |
| m.p. (°C.) | 1312 | 1407 | 1461 | 1497 | 1509 | 920 |
| Resistivity (ohms/sq) | 6.65 | 5.8 | 4.97 | 2.76 | 4.75 | 5.2 |
| Annealing Temps °C. and Times to Disilicide | 300->1 hr. -<2 hr. 325-<30 min | 325-2.5 hr. 350-1 h | 350->2 h -<4 h 375-45 min | 350->24 h 375-75 min 400-15 min | 325->8 h 350->1 h 375-45 min | <275-1h |
| Disilicides | $GdSi_2$ | $DySi_2$ | $HoSi_2$ | $ErSi_2$ | $YSi_2$ | $LaSi_2$ |
| Structure | Ortho | Ortho | Hex/Ortho | Hex | Hex/Ortho | Tetra. |
| (ohms/sq.) | 6.6 | 6.5 | 5.9 | 2.44 | 4.3 | 3.7 |
| m.p. (°C.) | 2100 | 1550 | | | 1635 | 1580 |

Having thus described our invention, what we claim as new, and desired to secure by Letters Patent is:

1. A disilicide Schottky barrier contact having a barrier potential of about 0.4 eV, comprising:
   an n-type silicon substrate; and
   a rare earth metal deposited on said n-type silicon substrate, wherein said disilicide Schottky barrier contact is formed by heating said silicon substrate and said rare earth metal.

2. A disilicide Schottky barrier contact as set forth in claim 1 wherein said rare earth metal is a member of the group consisting of Ho, Gd, Er, Dy, Y and La.

3. A disilicide Schottky barrier contact as set forth in claim 2 wherein said heating is at approximately 400° C. for about 30 minutes.

4. A disilicide Schottky barrier contact as set forth in claim 3 including an oxidation barrier layer deposited on said rare earth metal.

5. A disilicide Schottky barrier contact as set forth in claim 4 wherein said oxidation barrier layer is one member of the group consisting of a transition metal Pt, Pd, Ni and refractory metals W, V, Cr, Mo and Ti.

6. A disilicide Schottky barrier contact having a barrier potential of about 0.7 eV, comprising:
   an p-type silicon substrate; and
   a rare earth metal deposited on said p-type silicon substrate, wherein said disilicide Schottky barrier contact is formed by heating said silicon substrate and said rare earth metal.

7. A disilicide Schottky barrier contact as set forth in claim 6 wherein said rare earth metal is a member of the group consisting of Ho, Gd, Er, Dy, Y and La.

8. A disilicide Schottky barrier contact as set forth in claim 7 wherein said heating is at approximately 400° C. for about 30 minutes.

9. A disilicide Schottky barrier contact as set forth in claim 8 including an oxidation barrier layer deposited on said rare earth metal.

10. A disilicide Schottky barrier contact as set forth in claim 9 wherein said oxidation barrier layer is one member of the group consisting of a transition metal Pt, Pd, Ni and refractory metals W, V, Cr, Mo and Ti.

* * * * *